(12) United States Patent
Veres et al.

(10) Patent No.: US 9,316,994 B2
(45) Date of Patent: Apr. 19, 2016

(54) IMAGING SYSTEM WITH ELECTROPHOTOGRAPHIC PATTERNING OF AN IMAGE DEFINITION MATERIAL AND METHODS THEREFOR

(75) Inventors: Janos Veres, San Jose, CA (US); David K. Biegelsen, Portola Valley, CA (US); Chu-heng Liu, Penfield, NY (US)

(73) Assignees: Xerox Corporation, Norwalk, CT (US); Palo Alto Research Center Incorporated, Palo Alto, CA (US)

( * ) Notice: Subject to any disclaimer, the term of this patent is extended or adjusted under 35 U.S.C. 154(b) by 855 days.

(21) Appl. No.: 13/548,146

(22) Filed: Jul. 12, 2012

(65) Prior Publication Data

US 2014/0013978 A1     Jan. 16, 2014

(51) Int. Cl.
   *B41F 7/14*     (2006.01)
   *G03G 17/02*    (2006.01)
   *B41F 7/24*     (2006.01)

(52) U.S. Cl.
   CPC . *G03G 17/02* (2013.01); *B41F 7/24* (2013.01)

(58) Field of Classification Search
   CPC .............................. B41C 1/1058; G03G 13/283
   See application file for complete search history.

(56) References Cited

U.S. PATENT DOCUMENTS

| | | |
|---|---|---|
| 3,285,741 A | 11/1966 | Gesierich |
| 3,741,118 A | 6/1973 | Carley |
| 3,800,699 A | 4/1974 | Carley |
| 3,877,372 A | 4/1975 | Leeds |
| 4,627,349 A | 12/1986 | Claussen |
| 4,718,340 A * | 1/1988 | Love, III ........................ 101/116 |
| 4,887,528 A | 12/1989 | Ruge |
| 5,067,404 A | 11/1991 | Frunder et al. |
| 5,701,815 A | 12/1997 | Bocko |
| 5,855,173 A | 1/1999 | Chatterjee et al. |
| 6,125,756 A | 10/2000 | Nussel et al. |
| 6,146,798 A | 11/2000 | Bringans et al. |

(Continued)

FOREIGN PATENT DOCUMENTS

| | | |
|---|---|---|
| DE | 101 60 734 A1 | 7/2002 |
| DE | 103 60 108 A1 | 7/2004 |

(Continued)

OTHER PUBLICATIONS

U.S. Appl. No. 13/095,714, filed Apr. 27, 2011, Stowe et al.

(Continued)

*Primary Examiner* — Joshua D Zimmerman
(74) *Attorney, Agent, or Firm* — Ronald E. Prass, Jr.; Prass LLP

(57) ABSTRACT

A system comprises an electrophotographic subsystem, a transfer subsystem, an imaging member, and an inking subsystem. The electrophotographic subsystem comprises a photoreceptor, a charging subsystem, an exposure subsystem, and a development subsystem. In operation, the photoreceptor is charged areawise. An exposure pattern is formed by the exposure subsystem on the surface of the charged photoreceptor to thereby write a latent charge image onto the photoreceptor surface. The image is developed with an image definition material, such as a dampening fluid. The image definition material forms a positive pattern of the image to be printed. The image pattern is then transferred to the reimageable surface. The transferred pattern is then developed by selectively applying an ink over regions of image definition material. The inked image may be transferred to a substrate.

15 Claims, 12 Drawing Sheets

(56) References Cited

U.S. PATENT DOCUMENTS

| | | |
|---|---|---|
| 6,318,264 B1 | 11/2001 | D'Heureuse et al. |
| 6,561,090 B1 | 5/2003 | Spooner |
| 6,725,777 B2 | 4/2004 | Katano |
| 6,841,366 B1 | 1/2005 | Bower et al. |
| 6,901,853 B2 | 6/2005 | Baldy et al. |
| 7,020,355 B2 | 3/2006 | Lahann et al. |
| 7,061,513 B2 | 6/2006 | Katano et al. |
| 7,100,503 B2 | 9/2006 | Wiedemer et al. |
| 7,191,705 B2 | 3/2007 | Berg et al. |
| 2003/0167950 A1 | 9/2003 | Mori |
| 2004/0011234 A1 | 1/2004 | Figov |
| 2005/0178281 A1 | 8/2005 | Berg et al. |
| 2005/0258136 A1 | 11/2005 | Kawanishi |
| 2006/0152566 A1 | 7/2006 | Taniuchi |
| 2007/0199457 A1 | 8/2007 | Cyman, Jr. et al. |
| 2007/0199458 A1 | 8/2007 | Cyman, Jr. et al. |
| 2007/0199459 A1 | 8/2007 | Cyman, Jr. et al. |
| 2007/0199460 A1 | 8/2007 | Cyman, Jr. et al. |
| 2007/0199461 A1 | 8/2007 | Cyman, Jr. et al. |
| 2007/0199462 A1 | 8/2007 | Cyman, Jr. et al. |
| 2008/0011177 A1 | 1/2008 | Muraoka |
| 2008/0032072 A1 | 2/2008 | Taniuchi |
| 2008/0223240 A1 | 9/2008 | Drury |
| 2010/0031838 A1 | 2/2010 | Lewis et al. |
| 2011/0139025 A1* | 6/2011 | Kitakami .................. 101/395 |

FOREIGN PATENT DOCUMENTS

| | | |
|---|---|---|
| DE | 10 2006 050744 A1 | 4/2008 |
| DE | 10 2008 062741 | 7/2010 |
| EP | 1 935 640 A2 | 6/2008 |
| EP | 1 938 987 A2 | 7/2008 |
| EP | 1 964 678 A2 | 9/2008 |
| WO | 2006/133024 | 12/2006 |
| WO | WO 2009025821 A1 | 2/2009 |

OTHER PUBLICATIONS

U.S. Appl. No. 13/095,737, filed Apr. 27, 2011, Stowe et al.
U.S. Appl. No. 13/095,745, filed Apr. 27, 2011, Stowe et al.
U.S. Appl. No. 13/095,757, filed Apr. 27, 2011, Stowe et al.
U.S. Appl. No. 13/095,764, filed Apr. 27, 2011, Stowe et al.
U.S. Appl. No. 13/095,773, filed Apr. 27, 2011, Stowe et al.
U.S. Appl. No. 13/095,778, filed Apr. 27, 2011, Stowe et al.
U.S. Appl. No. 13/204,515, filed Aug. 5, 2011, Stowe et al.
U.S. Appl. No. 13/204,526, filed Aug. 5, 2011, Stowe et al.
U.S. Appl. No. 13/204,548, filed Aug. 5, 2011, Stowe et al.
U.S. Appl. No. 13/204,560, filed Aug. 5, 2011, Pattekar et al.
U.S. Appl. No. 13/204,567, filed Aug. 5, 2011, Stowe et al.
U.S. Appl. No. 13/204,578, filed Aug. 5, 2011, Stowe et al.
U.S. Appl. No. 13/366,947, filed Feb. 6, 2012, Biegelsen.
U.S. Appl. No. 13/426,209, filed Mar. 21, 2012, Liu et al.
U.S. Appl. No. 13/426,262, filed Mar. 21, 2012, Liu et al.
U.S. Appl. No. 13/548,127, filed Jul. 12, 2012, Veres et al.
U.S. Appl. No. 13/548,134, filed Jul. 12, 2012, Veres et al.
U.S. Appl. No. 13/548,151, filed Jul. 12, 2012, Veres et al.
U.S. Appl. No. 13/548,155, filed Jul. 12, 2012, Veres et al.
U.S. Appl. No. 13/548,157, filed Jul. 12, 2012, Veres et al.
Shen et al., "A new understanding on the mechanism of fountain solution in the prevention of ink transfer to the non-image area in conventional offset lithography", J. Adhesion Sci. Technol., vol. 18, No. 15-16, pp. 1861-1887 (2004).
Katano et al., "The New Printing System Using the Materials of Reversible Change of Wettability", International Congress of Imaging Science 2002, Tokyo, pp. 297 et seq. (2002).

* cited by examiner

IMAGING SYSTEM WITH ELECTROPHOTOGRAPHIC PATTERNING OF AN IMAGE DEFINITION MATERIAL AND METHODS THEREFOR

BACKGROUND

The present disclosure is related to marking and printing methods and systems, and more specifically to methods and systems for variably marking or printing data using lithographic and electrophotographic systems and methods.

Offset lithography is a common method of printing today. (For the purposes hereof, the terms "printing" and "marking" are interchangeable.) In a typical lithographic process a printing plate, which may be a flat plate, the surface of a cylinder, or belt, etc., is formed to have "image regions" formed of hydrophobic and oleophilic material, and "non-image regions" formed of a hydrophilic material. The image regions are regions corresponding to the areas on the final print (i.e., the target substrate) that are occupied by a printing or marking material such as ink, whereas the non-image regions are the regions corresponding to the areas on the final print that are not occupied by said marking material. The hydrophilic regions accept and are readily wetted by a water-based fluid, commonly referred to as a fountain solution (typically consisting of water and a small amount of alcohol as well as other additives and/or surfactants to reduce surface tension). The hydrophobic regions repel fountain solution and accept ink, whereas the fountain solution formed over the hydrophilic regions forms a fluid "release layer" for rejecting ink. Therefore the hydrophilic regions of the printing plate correspond to unprinted areas, or "non-image areas", of the final print.

The ink may be transferred directly to a substrate, such as paper, or may be applied to an intermediate surface, such as an offset (or blanket) cylinder in an offset printing system. The offset cylinder is covered with a conformable coating or sleeve with a surface that can conform to the texture of the substrate, which may have surface peak-to-valley depth somewhat greater than the surface peak-to-valley depth of the imaging plate. Also, the surface roughness of the offset blanket cylinder helps to deliver a more uniform layer of printing material to the substrate free of defects such as mottle. Sufficient pressure is used to transfer the image from the offset cylinder to the substrate. Pinching the substrate between the offset cylinder and an impression cylinder provides this pressure.

In one variation, referred to as dry or waterless lithography or driography, the plate cylinder is coated with a silicone rubber that is oleophobic and physically patterned to form the negative of the printed image. A printing material is applied directly to the plate cylinder, without first applying any fountain solution as in the case of the conventional or "wet" lithography process described earlier. The printing material includes ink that may or may not have some volatile solvent additives. The ink is preferentially deposited on the imaging regions to form a latent image. If solvent additives are used in the ink formulation, they preferentially diffuse towards the surface of the silicone rubber, thus forming a release layer that rejects the printing material. The low surface energy of the silicone rubber adds to the rejection of the printing material. The latent image may again be transferred to a substrate, or to an offset cylinder and thereafter to a substrate, as described above.

The above-described lithographic and offset printing techniques utilize plates which are permanently patterned, and are therefore useful only when printing a large number of copies of the same image (long print runs), such as magazines, newspapers, and the like. Furthermore, they do not permit creating and printing a new pattern from one page to the next without removing and replacing the print cylinder and/or the imaging plate (i.e., the technique cannot accommodate true high speed variable data printing wherein the image changes from impression to impression, for example, as in the case of digital printing systems). Furthermore, the cost of the permanently patterned imaging plates or cylinders is amortized over the number of copies. The cost per printed copy is therefore higher for shorter print runs of the same image than for longer print runs of the same image, as opposed to prints from digital printing systems.

Lithography and the so-called waterless process provide very high quality printing, in part due to the quality and color gamut of the inks used. Furthermore, these inks—which typically have a very high color pigment content (typically in the range of 20-70% by weight)—are very low cost compared to toners and many other types of marking materials. Thus, while there is a desire to use the lithographic and offset inks for printing in order to take advantage of the high quality and low cost, there is also a desire to print variable data from page to page. Heretofore, there have been a number of hurdles to providing variable data printing using these inks. Furthermore, there is a desire to reduce the cost per copy for shorter print runs of the same image.

One problem encountered is that offset inks have too high a viscosity (often well above 50,000 cps) to be useful in nozzle-based inkjet systems. In addition, because of their tacky nature, offset inks have very high surface adhesion forces relative to electrostatic forces and are therefore difficult to manipulate onto or off of a surface using electrostatics. (This is in contrast to dry or liquid toner particles used in electrographic systems, which have low surface adhesion forces due to their particle shape and the use of tailored surface chemistry and special surface additives.)

Efforts have been made to create lithographic and offset printing systems for variable data in the past. One example is disclosed in U.S. Pat. No. 3,800,699, incorporated herein by reference, in which an intense energy source such as a laser to pattern-wise evaporate a fountain solution.

In another example disclosed in U.S. Pat. No. 7,191,705, incorporated herein by reference, a hydrophilic coating is applied to an imaging belt. A laser selectively heats and evaporates or decomposes regions of the hydrophilic coating. Next a water based fountain solution is applied to these hydrophilic regions rendering them oleophobic. Ink is then applied and selectively transfers onto the plate only in the areas not covered by fountain solution, creating an inked pattern that can be transferred to a substrate. Once transferred, the belt is cleaned, a new hydrophilic coating and fountain solution are deposited, and the patterning, inking, and printing steps are repeated, for example for printing the next batch of images.

In yet another example, a rewritable surface is utilized that can switch from hydrophilic to hydrophobic states with the application of thermal, electrical, or optical energy. Examples of these surfaces include so called switchable polymers and metal oxides such as $ZnO_2$ and $TiO_2$. After changing the surface state, fountain solution selectively wets the hydrophilic areas of the programmable surface and therefore rejects the application of ink to these areas.

High-speed inkjet printing is another approach currently utilized for variable content printing. Special low-viscosity inks are used in these processes to permit rapid volume printing that can produce variable content up to page-by-page content variation. High-speed electrophotographic processes are also known.

However, there remain a number of problems associated with these techniques. For example, the process of selective evaporation of dampening fluid requires a relatively high-powered, coherent radiation source, which generates heat and consume undesirably large amount of power. Such high-powered radiation sources are also quite expensive.

High-speed inkjet systems and process rely on special low viscosity inks that produce a non-standard final printed product. Such inks are also limited in the color ranges available. Further, such inks are relatively quite costly.

High-speed electrophotographic systems and process require "liquid toners" (electrophotography typically being a dry process). These liquid toners are essentially charged toner particles suspended in an insulating liquid. Producing an appropriate liquid toner that appropriately balances color, ability to charge, cleanability, and low cost has proven difficult.

Switchable coatings, especially the switchable polymers discussed above, are typically prone to wear and abrasion and expensive to coat onto a surface. Another issue is that they typically do not transform between hydrophobic and hydrophilic states in the fast (e.g., sub-millisecond) switching timescales required to enable high-speed variable data printing. Therefore, their use would be mainly limited to short-run print batches rather than to truly variable data high speed digital lithography wherein every impression can have a different image pattern, changing from one print to the next.

SUMMARY

Accordingly, the present disclosure addresses the above problems, as well as others, enabling the printing of variable content without complex toners and supporting systems. The present disclosure is directed to systems and methods for providing hybrid electrophotography and lithography.

A system according to one embodiment of the present disclosure comprises an electrophotographic subsystem, a transfer subsystem, an imaging member, and an inking subsystem. The electrophotographic subsystem comprises a photoreceptor, a charging subsystem, an exposure subsystem, and in numerous embodiments a development subsystem.

In operation, the photoreceptor is charged areawise. A light beam from the exposure subsystem is then scanned and pulsed onto the surface of the charged photoreceptor to thereby write a charge pattern representing a latent positive image (the same as the final ink image to be applied to a substrate) onto the photoreceptor surface.

In certain embodiments, the latent charge is developed with an image definition material, such as a liquid or dry toner, that is itself charged (or contains charged particles) in such a manner as to be attracted to the latent charge regions on the photoreceptor surface. In the case of a liquid, the image definition material may function as a dampening fluid that is preferentially attractive to ink ("ink-philic") applied in subsequent steps. In certain embodiments disclosed herein, the liquid and any particles therein have no pigmentation, although we interchangeably refer to the liquid as an image definition material and dampening fluid herein. In the case of dry toner, the image definition material may form an ink-attractive ("ink-philic") pattern that also is preferentially attractive to ink applied in subsequent steps. It will be appreciated that while we refer to a material as toner in the present disclosure, this reference is for convenience and clarity, and non-toner or toner-like particulate materials that provide the same or similar functionality are within the scope of the present disclosure.

A positive pattern of the image to be printed may therefore be formed of image definition material on the photoreceptor surface. This positive image is then transferred to the reimageable surface. The positive image is then developed over the reimageable surface with an ink having desirable properties such as having an appropriate color, providing a desirable final surface quality, having a low cost, being environmentally benign, and so on. The reimageable surface may be highly ink rejective ("ink-phobic") as compared to the image definition material, such that the ink is preferentially disposed over the image definition material. Ink is rejected by the reimageable surface, or by a segregation material deposited thereover, in the regions where no image definition material resides.

The inked image is then transferred to a substrate at a nip roller or the like, preferentially splitting from at least some of the image definition material to the substrate. An optional cleaning subsystem will remove any residual image definition material and/or segregation material on the imaging member that does not otherwise evaporate, as well as any residual ink, readying the imaging member for a next printing pass. Post printing, liquid image definition material transferred to the substrate may quickly evaporate, leaving the inked image. Optionally, image definition material transferred with the ink to the substrate may provide a desired surface quality or functionality to the ink image, such as controlling material viscosity, delivering additives (e.g., photo-curing or thermal-curing agents, fixing agents, etc.), reflectivity (e.g., gloss), mechanical strength, waterproofing, texture, adding encoding material (e.g., magnetic or electrostatically chargeable particles), and so on. Certain of these qualities/functions may be realized by heating or cooling the inked image on the substrate, by reaction with the substrate, and so on.

Magnetic particles (either paramagnetic or having a permanent magnetic moment) such as those used in magnetic inks and toner for magnetic ink character recognition (MICR) applications may be used with the resultant property that they can be extracted from the surface of the ink using a strong magnetic field. The magnetic particles can be made of iron oxides or similar materials and, in liquid carriers, the particles can be sub-micron in diameter and transparent in the visible wavelengths. Thus, cleaning of the magnetic toner may be accomplished, for example, by passing the surface through a sufficiently strong magnetic field such that the magnetic particles are pulled from the surface, where they can then be recycled or disposed.

In an alternate embodiment, the image definition material wets the ink. It may be relatively hydrophobic (as is the ink) and the reimageable surface relatively hydrophilic. In this embodiment, the image definition material may be assisted in at least temporarily adhering to (wetting) the reimageable surface by different techniques, such as applying a counter-charge to assist in transferring the fluid to the reimageable surface, utilizing a bifunctional surfactant that is hydrophilic on one end and hydrophobic on other end, and so on. Field assist, composition of the reimageable surface, etc. may also be employed to affect transfer to substrate. Following transfer of the image definition material to the imaging member, a segregation material layer (e.g., water or a water-based solution) is applied over the imaging member, with the result being segregation material disposed in regions where no image definition material resides over the imaging member. Ink, of a type that is rejected by the segregation material, (e.g., that is relatively hydrophobic) is applied such that it preferentially resides over the image definition material. The ink is then transferred to a substrate at a transfer nip. Some volume of image definition material may transfer to the substrate with the ink. Again, this may be advantageously controlled to provide a desired surface finish, fixing of the ink to the substrate, viscosity control, delivery of additives (e.g., photo-curing or thermal-curing agents) to the inked image, etc. Some volume of the segregation material may also transfer to the substrate with the ink, although it may quickly evaporate from the substrate surface.

In still another embodiment, a latent positive image of image definition material is formed on the photoreceptor surface as above. The latent image is then developed with ink while still on the photoreceptor. The ink has an affinity for the image definition material as compared to the photoreceptor surface, and therefore forms an inked image corresponding to the image formed by the image definition material. The inked image is transferred to an imaging member with or without the image definition material. Electrostatics or other mechanisms may be used to separate or stratify the ink and the image definition material prior to transfer to the substrate.

According to still further embodiments, a relatively uniform image definition material layer is deposited over the reimageable surface. A latent charge pattern is formed at the surface of the photoreceptor, as previously described. The image forming material has an affinity (e.g., electrostatic) for the photoreceptor where the charge is present, causing image definition material to be removed from the surface of the imaging member in locations corresponding to charged areas of the photoreceptor. Ink is then developed over the image definition material, and the inked image transferred to the substrate, essentially as previously discussed. Optionally, a segregation material such as water or a similar fluid may be introduced between areas of image forming material to assist with ink image definition.

According to yet another embodiment, a relatively uniform layer of segregation material (e.g., water) is deposited over the reimageable surface. A latent charge pattern is formed at the surface of the photoreceptor, and developed with image definition material, as previously described. The image definition material is transferred to the reimageable surface such that it at least partially embeds in the segregation material layer. Optionally, the electrostatic charge state of the image definition material and the reimageable surface may be employed to assist with the affinity of the image definition material to the reimageable surface. Ink is then developed over the image definition material, and the inked image transferred to the substrate, essentially as previously discussed.

The above is a summary of a number of the unique aspects, features, advantages, and embodiments of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that description of well-known starting materials, processing techniques, components, equipment and other well-known details are merely summarized or are omitted so as not to unnecessarily obscure the details of the present disclosure. Thus, where details are otherwise well known, we leave it to the application of the present disclosure to suggest or dictate choices relating to those details.

Figure 1:
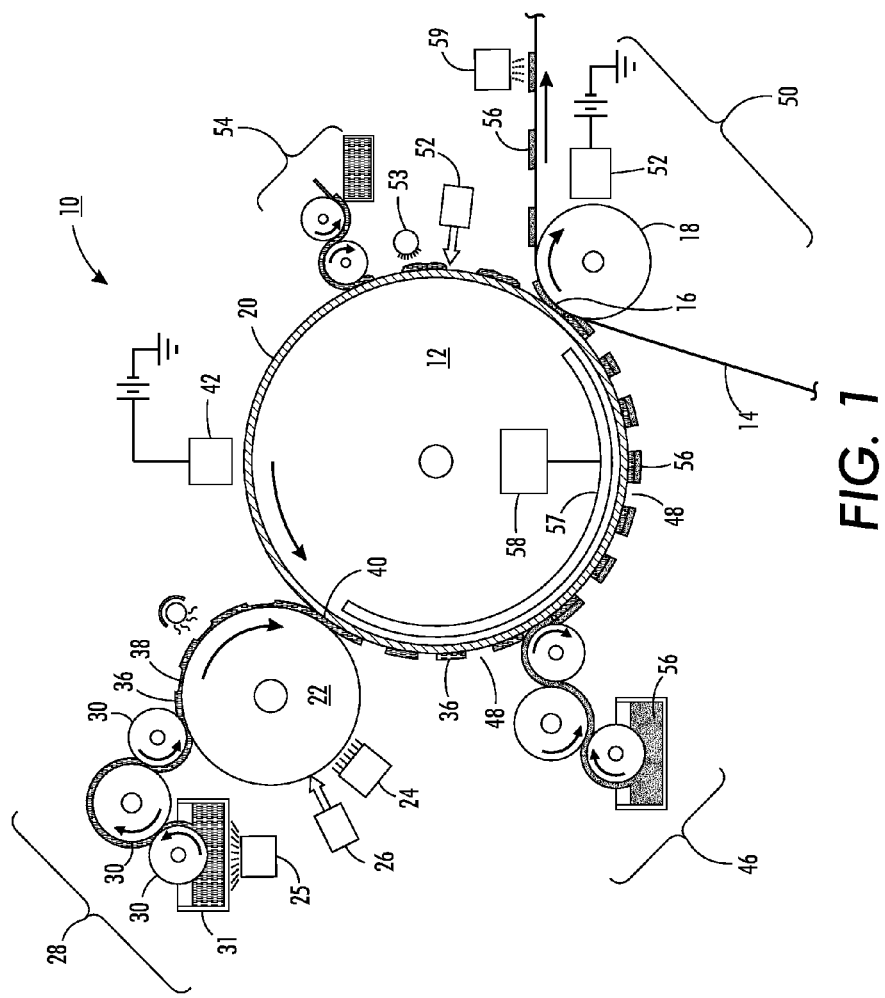
FIG. 1 is a side view of a system for variable lithography according to an embodiment of the present disclosure.

With reference to FIG. 1, there is shown therein a system 10 for electrophotographic patterning of an image definition material according to one embodiment of the present disclosure. System 10 comprises an imaging member 12, in this embodiment a drum, but may equivalently be a plate, belt, etc., surrounded by a number of subsystems described in detail below. Imaging member 12 applies an ink image to substrate 14 at nip 16 where substrate 14 is pinched between imaging member 12 and an impression roller 18. A wide variety of types of substrates, such as paper, plastic or composite sheet film, ceramic, glass, etc. may be employed. For clarity and brevity of this explanation we assume the substrate is paper, with the understanding that the present disclosure is not limited to that form of substrate. For example, other substrates may include cardboard, corrugated packaging materials, wood, ceramic tiles, fabrics (e.g., clothing, drapery, garments and the like), transparency or plastic film, metal foils, etc. A wide latitude of marking materials may be used including those with pigment densities greater than 10% by weight including but not limited to metallic inks or white inks useful for packaging. For clarity and brevity of this portion of the disclosure we generally use the term ink, which will be understood to include the range of marking materials such as inks, pigments, and other materials, which may be applied by systems and methods, disclosed herein.

In one embodiment, imaging member 12 comprises a thin reimageable surface layer 20 formed over a structural mounting layer (for example metal, ceramic, plastic, etc.), which together forms a rewriteable printing blanket. Additional structural layers, such as an intermediate layer (not shown) below reimageable surface layer 20 may be electrically insulating (or conducting), thermally insulating (or conducting), have variable compressibility and durometer, and so forth. In one embodiment, an intermediate layer is composed of closed cell polymer foam sheets and woven mesh layers (for example, cotton) laminated together with very thin layers of adhesive. Typically, blankets are optimized in terms of compressibility and durometer using a 3-4 ply layer system that is between 1-3 mm thick with reimageable surface layer 20 designed to have optimized texture, toughness, and surface energy properties.

Reimageable surface layer 20 may take the form of a stand-alone drum or web, or a flat blanket wrapped around a cylinder core. In another embodiment the reimageable surface layer 20 is a continuous elastic sleeve placed over a cylinder core. Flat plate, belt, and web arrangements (which may or may not be supported by an underlying drum configuration) are also within the scope of the present disclosure. For the purposes of the following discussion, it will be assumed that reimageable surface layer 20 is carried by a cylinder core, although it will be understood that many different arrangements, as discussed above, are contemplated by the present disclosure.

According to various embodiments disclosed herein, reimageable surface layer 20 should be of a material that rejects wetting with the ink (i.e., "ink-phobic"). Reimageable surface layer 20 should also be of a material that provides relatively good adhesion and/or wetting of the image definition material (discussed further below). Various examples include polytetrafluoroethylene (PTFE, or Teflon) and fluorinated silicone surface layers, when used with water-based inks or other inks with relatively high surface energies.

A photo-responsive photoreceptor 22 is charged by an appropriate mechanism 24, such as a corona discharge device, to have a first charge polarity. Charged photoreceptor 22 is then exposed, such as by light from a laser or LED array source 26. In the case of a laser, source 26 is both pulsed, such as by a controller (not shown) and scanned, such as by a raster output scanner (ROS) subsystem (not shown). In the case of an LED array or light bar, the individual elements comprising the array are modulated to produce the desired exposure pattern line-by-line. By way of exposure, the scanned and pulse beam or pulsed linear array creates a latent charge image on the surface of photoreceptor 22.

It is understood that for the purposes of this disclosure, the term "light" is used to refer to wavelengths of electromagnetic radiation for exposure of photoreceptor 22. As used herein, "light" may be any of a wide range of wavelengths from the electromagnetic spectrum, whether normally visible to the unaided human eye (visible light), ultraviolet (UV) wavelengths, infrared (IR) wavelengths, micro-wave wavelengths, and so on.

An image definition material is then applied to the latent image on the surface of photoreceptor 22 by an image definition material subsystem 28. In one implementation in which the image definition material is a liquid, image definition material subsystem 28 comprises a series of rollers 30 (referred to as a dampening unit) for uniformly wetting the surface of photoreceptor 22 with an image definition material 31 from reservoir 32. It is well known that many different types and configurations of dampening units exist. For example, spray systems, condensation systems, extrusion systems, and so on may alternatively be employed. The purpose of the dampening unit is to deliver a controlled thickness of image definition material 31 on regions of photoreceptor 22 defined by the latent charge image over unexposed (charged) regions of the photoreceptor. As will be explained further below, the image definition material may comprise a liquid toner. Therefore, liquid toner delivery subsystems may also be employed as the image definition material subsystem 28.

The image definition material applied by image definition material subsystem 28 essentially takes the place of toner in a typical electrophotographic process. According to one embodiment, the image definition material has certain properties rendering it both an effective electrophotographic printing material and an ink-philic lithographic image definition material. The image definition material may comprise a carrier fluid that includes a toner-like chargeable material, such as organic/inorganic compact particles or dendritically shaped brushes, polymers or aggregates, iron oxide (magnetic), or metal or dielectric or other particles. In certain embodiments discussed herein, the particles may also have a surface quality and composition such that they provide a desired degree of (either a significant amount or specifically as little as possible) liquid drag within the carrier fluid. Many materials are suitable as long as the material can carry electrostatic charge. It should be noted that fewer requirements on the ink composition exist in the current application so less expensive materials can be used. In one embodiment, polymer aggregate further comprises charge control agents. The polymer material may be partially cross-linked to provide a plurality of aggregates.

The particles may be dispersed in a carrier fluid. In one embodiment, the carrier fluid is insulative. Examples include (but are not limited to) oils, or fluorosolvents such as Isopar™ (synthetic isoparaffin, from Exxon Mobil, Inc.), and the like. A surfactant monolayer is one example. It could either: bind to oleophobic reimageable surface and bind oil based ink, or bind to hydrophobic reimageable surface and bind water based ink. It is also useful, again for reasons discussed further below, that carrier fluid be relatively cohesive. Materials used as an ink vehicle in liquid electrophotography may be considered. The carrier fluid with particles may be formulated as a low solid content, colorless liquid "toner". Optionally, the carrier fluid may include additives for image fixing, providing a desired image finish (e.g., gloss), viscosity control, thermal- and/or photo-curing agents, etc.

According to one embodiment of the present disclosure, the particles in the image definition material are provided with a second charge (i.e., of a second charge polarity). This charge is of opposite sign (polarity) to the charge applied to the photoreceptor 22. The particles may be charged as a step in the process of forming the image definition material, e.g. triboelectrically or by zeta potential formation, or may be charged in situ prior to application such as by a charging device 25.

Areas of photoreceptor 22 that are not exposed by light source 26 remain charged, and the particles in the image definition material are selectively attracted thereto. Thus, as a second consequence the particles are more strongly attracted to the photoreceptor in these regions. (In an alternative embodiment, the particles are uniformly dispersed in the image definition material and can arrive more quickly at the attracting regions of the photoreceptor.) The particles migrate toward the charged region of photoreceptor 22, dragging carrier fluid with them. As the photoreceptor leaves the nip with roller 30, carrier fluid splits providing a net fluid thickness on the photoreceptor surface greater than the thickness of adhering toner particles. Over regions of the photoreceptor that have been exposed by light source 26 (discharged regions), image definition material will be repelled by the nature of the photoreceptor surface (e.g., high interface energy between the photoreceptor surface and the image definition material), leaving those regions over the surface of photoreceptor 22 without image definition material. In certain cases, motion of the particles may also carry fluid away from regions that have been exposed by light source 26. This causes a splitting of the image definition material at the delivery roller 30, with fluid preferentially transferring to the photoreceptor over charged regions, and remaining on the delivery roller over uncharged regions. (The splitting may not be complete, but will be sufficient to provide image pattern formation, as discussed further below.)

Alternatively, precharging of reimageable surface 20 may be employed to attract oppositely charged particles thereto. In this case, the image definition material minimally wets the particles. After the toner on the reimageable surface binds the ink and transfers the ink, the particles remaining bound to reimageable surface 20 are charge-neutralized, for example by a scorotron 53 (or similar mechanism). The residual toner is then cleaned from the surface at 54.

Some or all of the carrier fluid may evaporate from the toner solution prior to transfer of the ink to substrate 14. The greater the amount of the fluid that evaporates, the greater the surface properties of the particles determine the wettability to the ink.

Figure 2A:
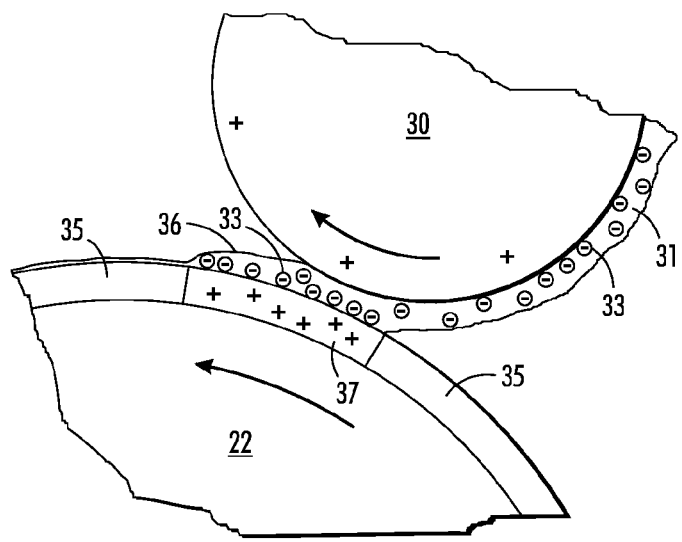
FIGS. 2A and 2B are side-view, cut-away illustrations of a mechanism for selectively applying image definition material to a surface of a photoreceptor according to one embodiment of the present disclosure.
Figure 2B:
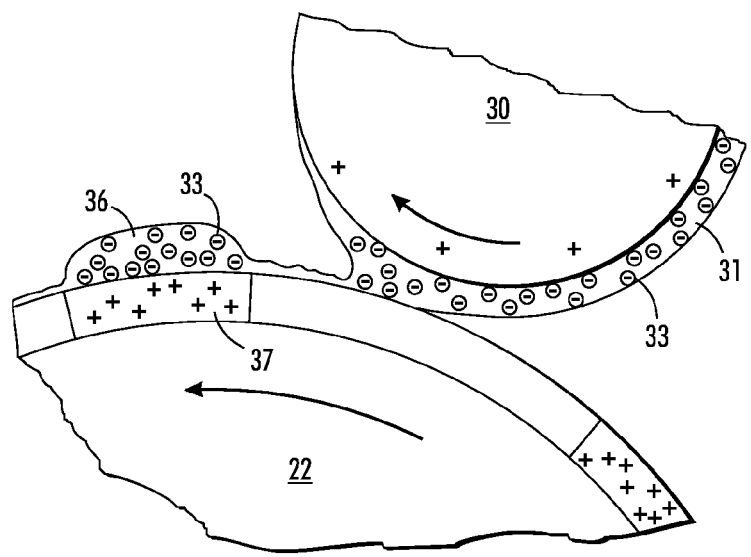

The process of developing the image definition material on the surface of photoreceptor 22 is illustrated in the example shown in FIGS. 2A and 2B. With reference to FIG. 2A, a region 35 of photoreceptor 22 has been exposed to light, thereby discharging that region. An adjacent region 37 has not been exposed, and therefore retains the initial charge applied to the photoreceptor. As image definition material 31 is brought proximate the surface of photoreceptor 22, particles 33 (or ionic species) are attracted to photoreceptor 22 in regions 37. The particles carry with them excess carrier fluid, thereby creating an image definition material region 36.

With reference to FIG. 2B, in regions over exposed portions of photoreceptor 22, where charge has been dissipated, image definition material 31 will be less attracted to photoreceptor 22, and will remain on roller 30. Roller 30 may be provided with a surface charge density (e.g., repulsive to the charge in region 37) to assist with this preferential transfer mechanism. In addition or as an alternative, the composition of the surface of photoreceptor 22 may be further selected to repel image definition material 31 absent any electrostatic attraction, to thereby improve the selectivity of this mechanism for forming regions 36.

One mechanism for electrostatically enhanced image definition material retention has been described above. However, many different mechanisms are possible, and the precise mechanism by which image definition material attaches to or is rejected by the photoreceptor does not form a limitation of the claims unless otherwise recited in those claims.

Returning to FIG. 1, the result of the aforementioned process is that numerous regions 36 are provided on the surface of photoreceptor 22, separated by regions 38 that are generally absent of image definition material. However, in certain embodiments, some residual image definition material may remain in regions 38 over unexposed regions of photoreceptor 22. This residual image definition material will form a relatively much thinner region (in cross-section) as compared with adjacent fluid regions remaining over exposed regions of photoreceptor 22. For example, in one embodiment regions 36 are on the order of 0.2 µm to 1.0 µm thick (and very uniform without pin holes), while residual image definition material regions 38 may be on the order of less than 0.1 µm. Thinner liquid regions require more force to split and therefore the adhesion to the reimageable surface 20 can be insufficient to transfer residual image definition material regions 38, yet strong enough to split regions 36. Provided that there is a contrast between the amount of the fluid present over exposed and non-exposed areas of the photoreceptor, a latent liquid image can nonetheless be formed which manifests in more or less fluid on the photoreceptor. Areas where a thinner layer of fluid is present can be evaporated or dried if desired by areawise heating by heating element 34. The latent negative image on photoreceptor 22 may then be transferred to reimageable surface 20 at transfer point 40.

As the relative motions of photoreceptor 22 and imaging member 12 proceed, image definition material regions 36 are transferred from the surface of photoreceptor 22 to reimageable surface 20. In one mechanism, the image definition material wets the reimageable surface, and due to the nature of reimageable surface 20 a portion of the image definition material transfers thereto. While some fluid may remain on photoreceptor 22 after transfer of the majority thereof to reimageable surface 20, and indeed some fluid in regions 38 may also be transferred, the relative volume and hence height above reimageable surface 20 of the transferred regions 38 will be sufficient to retain adequate contrast between the amount of the fluid in regions 36 and in regions 38 such that a liquid image is formed on reimageable surface 20.

Figure 3:
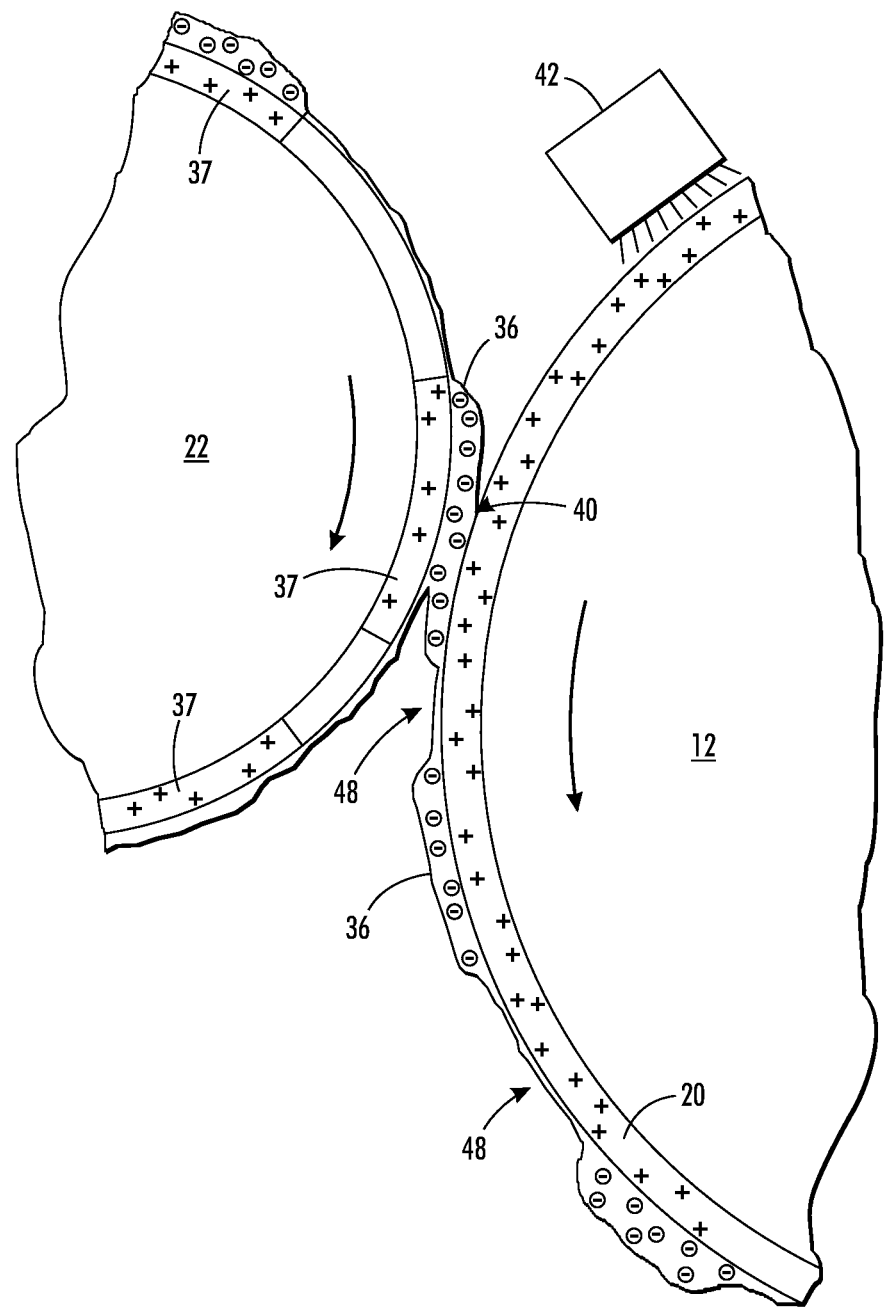
FIG. 3 is a side-view, cut-away illustration of a mechanism for transferring an image definition material image to the surface of an imaging member according to one embodiment of the present disclosure.

According to another embodiment of the present disclosure, illustrated in FIG. 3, charged particles in the image definition material are again used, this time to assist with the transfer of the image definition material from photoreceptor 22 to reimageable surface 20. In this embodiment, pre-charging or biasing reimageable surface 20, for example by charging device 42, may aid transfer of image definition material from photoreceptor 22 to reimageable surface 20. For example, if reimageable surface 20 is provided with an increased attractive charge to the image definition material as compared to regions 37 of photoreceptor 22, the image definition material will preferentially be attracted to reimageable surface 20. Due to surface tension, affinity of the image definition material to the surface of layer 20, and the aforementioned electrostatic attraction, the image definition material of regions 36 will wet the reimageable surface 20 where the two come into contact at transfer point 40. The image definition material will split as the photoreceptor and imaging member 12 rotate relative to one another, transferring substantially the entirety of image definition material regions 36 from photoreceptor 22 to reimageable surface 20. Any image definition material remaining on photoreceptor 22 may be removed or allowed to evaporate prior to the next cycle of charging and developing the photoreceptor.

Returning to FIG. 1, according to another embodiment of the present disclosure, the viscosity of the image definition material may be intentionally increased, particularly on the exposed surface opposite the surface of photoreceptor 22, so as to increase its adhesion to reimageable surface 20. In addition to its role in evaporating excess residual image definition material, heating element 34 may also serve to partially dry image definition material regions 36, transforming them to a higher viscosity or even semi-solid state. The viscosity of the fluid in regions 36 is thereby increased, particularly at exposed surfaces, and accordingly regions 36 tend to selectively adhere to reimageable surface 20 at transfer point 40.

The latent image formed by regions 36 now resident on reimageable surface 20 is next inked by inking subsystem 46. Inking subsystem 46 may consist of a "keyless" system using an anilox roller to meter offset ink 56 onto one or more forming rollers. Alternatively, inking subsystem 46 may consist of more traditional elements with a series of metering rollers that use electromechanical keys to determine the precise feed rate of the ink. The general aspects of inking subsystem 46 will depend on the application of the present disclosure, and will be well understood by one skilled in the art.

In order for ink 56 from inking subsystem 46 to selectively wet over regions 36, the ink must have sufficiently high adhesion to image definition material 31, and low enough cohesive energy to split onto regions 36 (and not into ink repelling regions 48). Furthermore, image definition material 31 must have sufficient adhesion to the reimageable surface 20, either due to surface wetting or external forces such as electrostatic or magnetic, to remain attached to surface 20 during inking and preferably during transfer. The adhesion can be reduced during or after transfer by oil expression or removal or reversal of electrostatic or magnetic forces. In embodiments in which the image definition material is a image definition material, the image definition material may be relatively tacky such that ink applied by inking subsystem 46 selectively adheres to the fluid. The ink composition may be selected such that it preferentially adheres to or mixes with the image definition material. In certain embodiments, the reimageable surface may be made to be ink-phobic. For example, the ink may include or be admixed with water, and reimageable surface 20 made to be hydrophobic.

Figure 4:
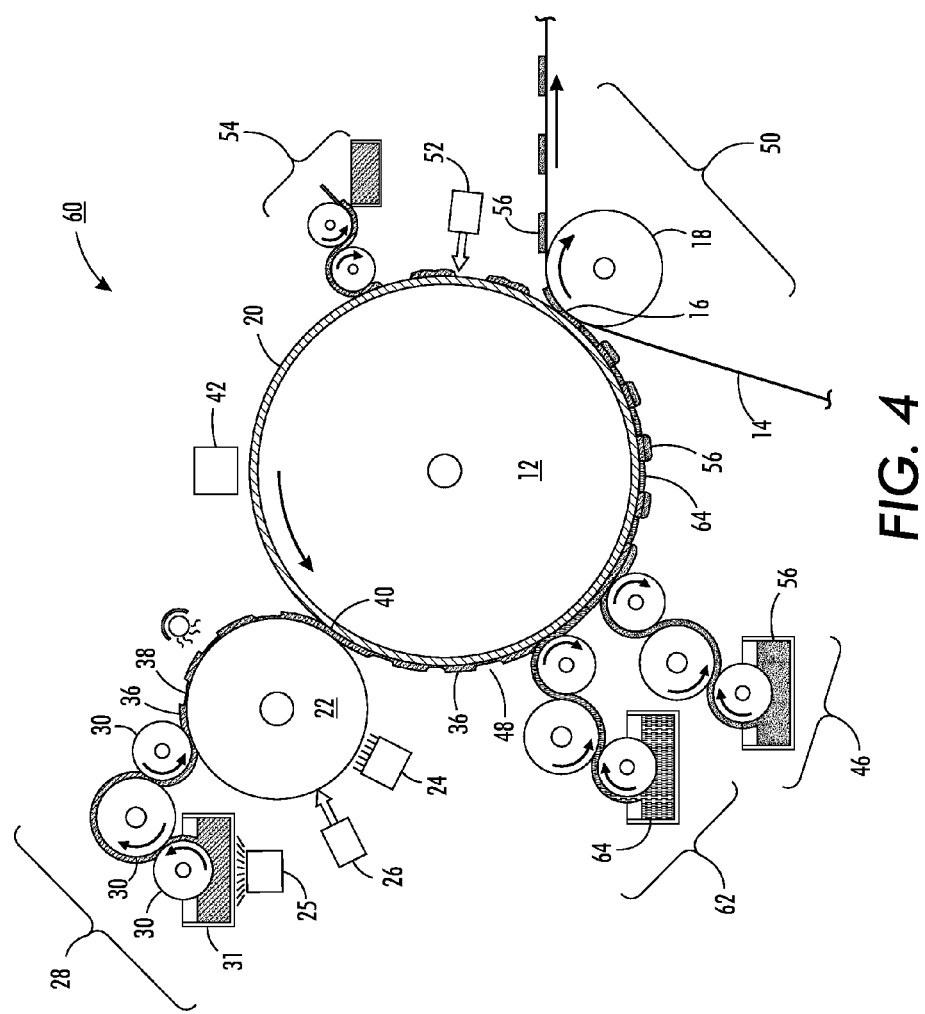
FIG. 4 is a side view of a system for variable lithography according to another embodiment of the present disclosure.

According to another embodiment 60, illustrated in FIG. 4, following transfer of region 36 of image definition material 31, a segregation material subsystem 62 deposits a segregation material 64 over reimageable surface 20 in regions 48. Segregation material 64 is ink-phobic such that ink deposited by inking subsystem 46 is rejected over material 64. In one embodiment, segregation material 64 is water or a water-based solution. Optionally, the material comprising reimageable surface 20 may be chosen to be hydrophilic and/or image definition material 31 chosen to be hydrophobic, thereby assisting in the selective deposition of segregation material 64 in regions 48 (i.e., between regions 36 of image definition material 31).

The ink 56 applied by inking subsystem 46 may be selected to be hydrophobic, thereby increasing the contrast between regions over image definition material regions 36 intended to be inked and regions 48 intended to be non-inked. There are somewhat conflicting requirements of the ink at this point. On one hand, the ink should have a sufficiently high viscosity that it selectively adheres to regions 36. On the other hand, the ink should have a sufficiently low viscosity that is relatively easily flows over and fully covers the surface of regions 36. Accordingly, the rheology of the ink may be adjusted for desired properties for example by adding a small percentage of a low molecular weight monomer or a lower viscosity oligomer to the ink. The ink rheology may also be controlled by selectively heating the ink within inking subsystem 46.

Returning to FIG. 1, ink 56 over regions 36 is next transferred to substrate 14 at transfer subsystem 50. In this embodiment, this is accomplished by passing substrate 14 through nip 16 between imaging member 12 and impression roller 18. Adequate pressure is applied between imaging member 12 and impression roller 18 such that the ink is brought into physical contact with substrate 14. Adhesion of the ink to substrate 14 and strong internal cohesion cause the ink to separate from image definition material regions 36, at least in part, and adhere to substrate 14. Impression roller or other elements of nip 16 may be cooled to further enhance the transfer of the inked latent image to substrate 14. Indeed, substrate 14 itself may be maintained at a relatively colder temperature than the ink on imaging member 12, or locally cooled, to assist in the ink transfer process.

Some image definition material may also transfer to substrate 14 and separate from reimageable surface 20. In cases where the image definition material comprises a liquid, the volume of this image definition material transferred will be minimal, and it will rapidly evaporate or be absorbed within the substrate. Optimal charge on surfaces 20 and substrate 14 and the electrostatic interaction with the particles in the image definition material can be set either to reduce or enhance transfer of the image definition material to substrate 14.

Alternatively, it is within the scope of this disclosure that an offset roller (not shown) may first receive the ink image pattern, and thereafter transfer the ink image pattern to a substrate, as will be well understood to those familiar with offset printing. Other modes of indirect transferring of the ink pattern from imaging member 12 to substrate 14 are also contemplated by this disclosure.

Following transfer of the majority of the ink to substrate 14, any residual ink and residual image definition material may be removed from reimageable surface 20, preferably without scraping or wearing that surface. In cases where the image definition material is an image definition material, most of the image definition material can be easily removed quickly by using an air knife 52 with sufficient airflow. However some amount of ink residue may still remain. Removal of this remaining ink may be accomplished in a variety of ways, such as by a cleaning subsystem 54 of the type disclosed in the aforementioned U.S. application for letters patent Ser. No. 13/095,714.

Figure 5:
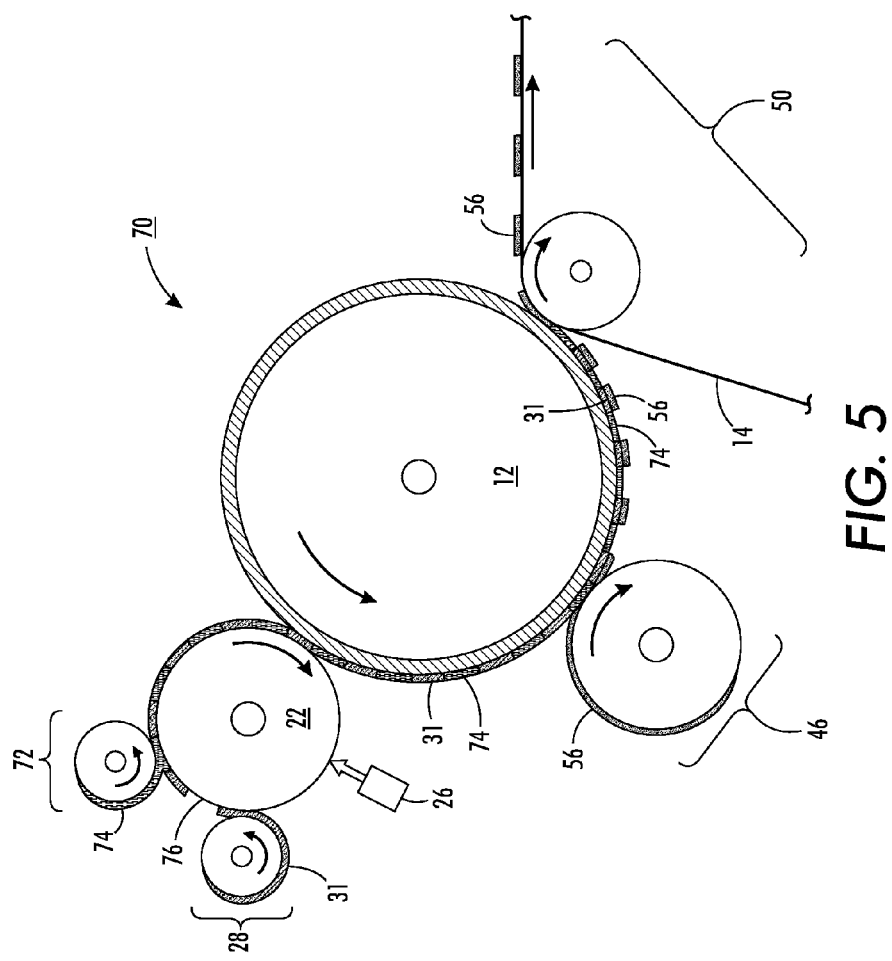
FIG. 5 is a side view of a system for variable lithography according to yet another embodiment of the present disclosure.

With reference to FIG. 5, another embodiment 70 of the present disclosure is illustrated. According to embodiment 70, in addition to elements previously described, a segregation fluid subsystem 72 is disposed proximate photoreceptor 22 such that a segregation fluid 74 may be deposited over the surface of photoreceptor 22. Segregation material 74 is selected to be ink-phobic. In one embodiment, segregation material 74 is water or a water-based solution.

In operation, photoreceptor 22 is charged then patterned by light source 26. Image definition material is deposited over the surface of photoreceptor 22 selectively over regions not exposed by light source 26. This produces regions 76 in which no image definition material is deposited over the surface of photoreceptor 22. As photoreceptor 22 rotates past segregation fluid subsystem 72, segregation material 74 is deposited preferentially in regions 76. Optionally, the surface of photoreceptor 22 may be temporarily or permanently hydrophilic and/or image definition material 31 chosen to be hydrophobic, thereby assisting in the selective deposition of segregation material 74 in regions 76 (i.e., between regions of image definition material 31). Inking of the image definition material and transfer of the inked image to substrate 14 may then proceed as previously discussed.

While in the preceding sections of this disclosure segregation material was illustrated as being deposited from a roller mechanism, many other mechanisms may equivalently server to selectively deposit segregation material. For example, a spray system may uniformly spray the segregation material over the reimageable surface 20 (e.g., embodiment 60 of FIG. 4) or the surface of the photoreceptor 22 (e.g., embodiment 70, FIG. 5). Alternatively, a nozzle system may be used to eject droplets of the segregation material over the target surface. Furthermore, in various embodiments the segregation material may be deposited pattern-wise over the target surface to match the spacings between the pattern of image forming material formed by image forming material subsystem 28 (e.g., selective droplet ejection similar to ink-jet printing). It will therefore be appreciated that segregation material may be deposited by a wide variety of techniques, and the present disclosure shall not be interpreted as being limited to any one such technique.

Figure 6:
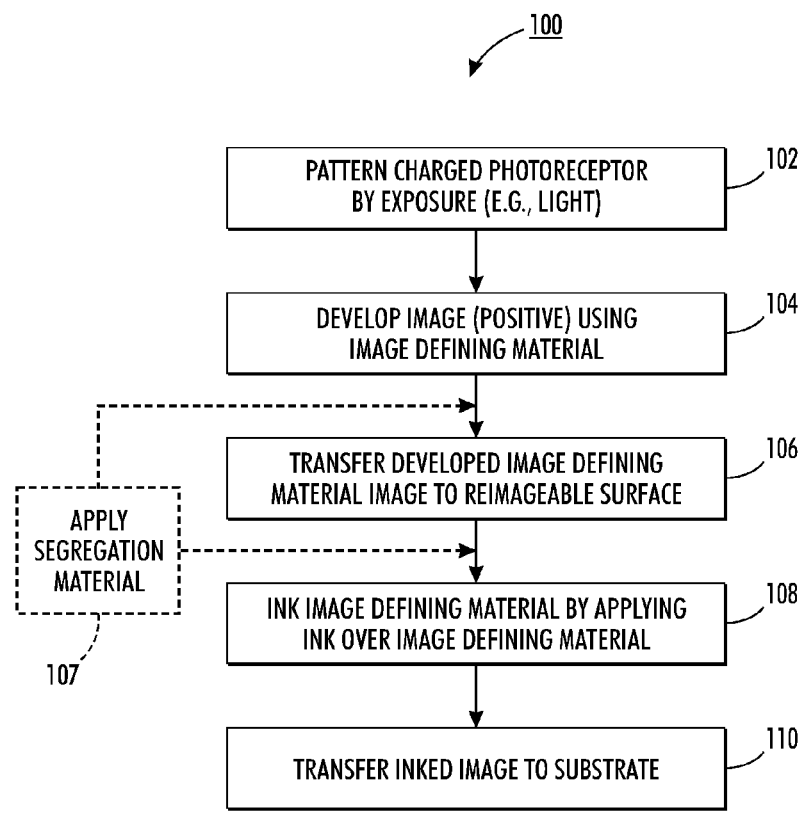
FIG. 6 is a flow diagram illustrating an embodiment of operation of a system for variable lithography for example of the type shown in FIG. 1, 4 or 5.

Accordingly, a complete hybrid system and process is disclosed in which, with reference to FIG. 6, a charged photoreceptor is patterned at 102 and developed at 104 from image definition material utilizing certain aspects of an electrophotography system and process, to form a latent positive of the image to be printed. The latent image of image definition material is transferred at 106 to an imaging member. A segregation material is optionally introduced either uniformly over the reimageable surface before or after transfer of the image definition material (optional steps are shown in dashed outline) at 107. The image definition material image (with or without segregation material) is inked on the surface of the imaging member at 108. The inked image is then transferred to a substrate at 110 utilizing certain aspects of a variable data lithography system and process.

Figure 7:
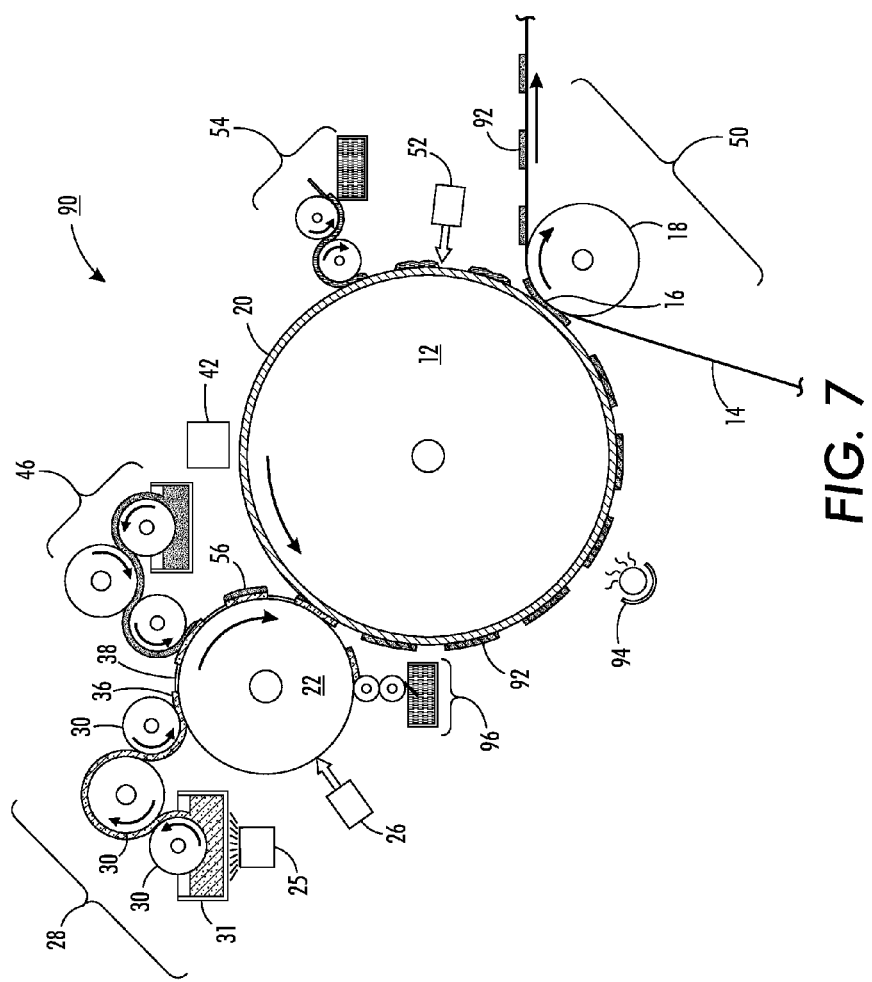
FIG. 7 is a side view of a system for variable lithography according to a further embodiment of the present disclosure.

With reference to FIG. 7, another embodiment 90 of the present disclosure is illustrated. According to this embodiment, inking subsystem 46 is disposed proximate photoreceptor 22 following the location of image definition material subsystem 28 in the direction of motion of photoreceptor 22. Inking subsystem 46 is disposed and configured to selectively deposit ink over regions 36 of image forming material 31 over the surface of photoreceptor 22.

In a first variation of this embodiment, the ink disposed over regions 36 of image definition material 31 is selectively transferred to reimageable surface 20, while image definition material 31 remains on the photoreceptor and is subsequently removed, such as by a cleaning subsystem 96. The image definition material is selected to be of a type that evaporates relatively quickly. Any image definition material that transfers with ink 56 to reimageable surface may evaporate shortly after such transfer. Regions of ink 56 transferred to reimageable surface 20 may then be transferred to substrate 14 at nip 16, as previously discussed.

In another variation of this embodiment, ink 56 may intermix with the image definition material 31 in regions 36 to form mixture regions 92. Mixture regions 92 are then transferred to reimageable surface 20, and ultimately transferred to substrate 14. For both dry toner that is subsequently dampened before inking and liquid toner the toner can stay with the photoreceptor and be reused while the liquid splits. Many liquids either wet the ink with some mixing and some fluids can be chosen which wet the ink but have very little uptake by the ink.

In yet another variation of this embodiment, the ink and image definition material do not separate at photoreceptor 22, nor do they mix, but rather are deposited together on reimageable surface 20 with the ink disposed between image definition material and reimageable surface 20. Some of the image definition material 31 may have evaporated prior to transfer to reimageable surface 20. Image definition material that did not evaporate prior to transfer may evaporate off of reimageable surface 20, leaving ink 56 exposed for transfer to substrate 14.

Optionally, in one or more of the above variations, an evaporation accelerator, such as a heat source 94, may be disposed and configured to assist with evaporation of image definition material 31 prior to transfer nip 16. Also optionally in one or more of the above variations, a desired quantity or component of the image definition material may remain with the ink over reimageable surface 20 and be transferred to substrate 14 to provide surface quality control, accelerate or assist fixing, and so forth.

Figure 8:
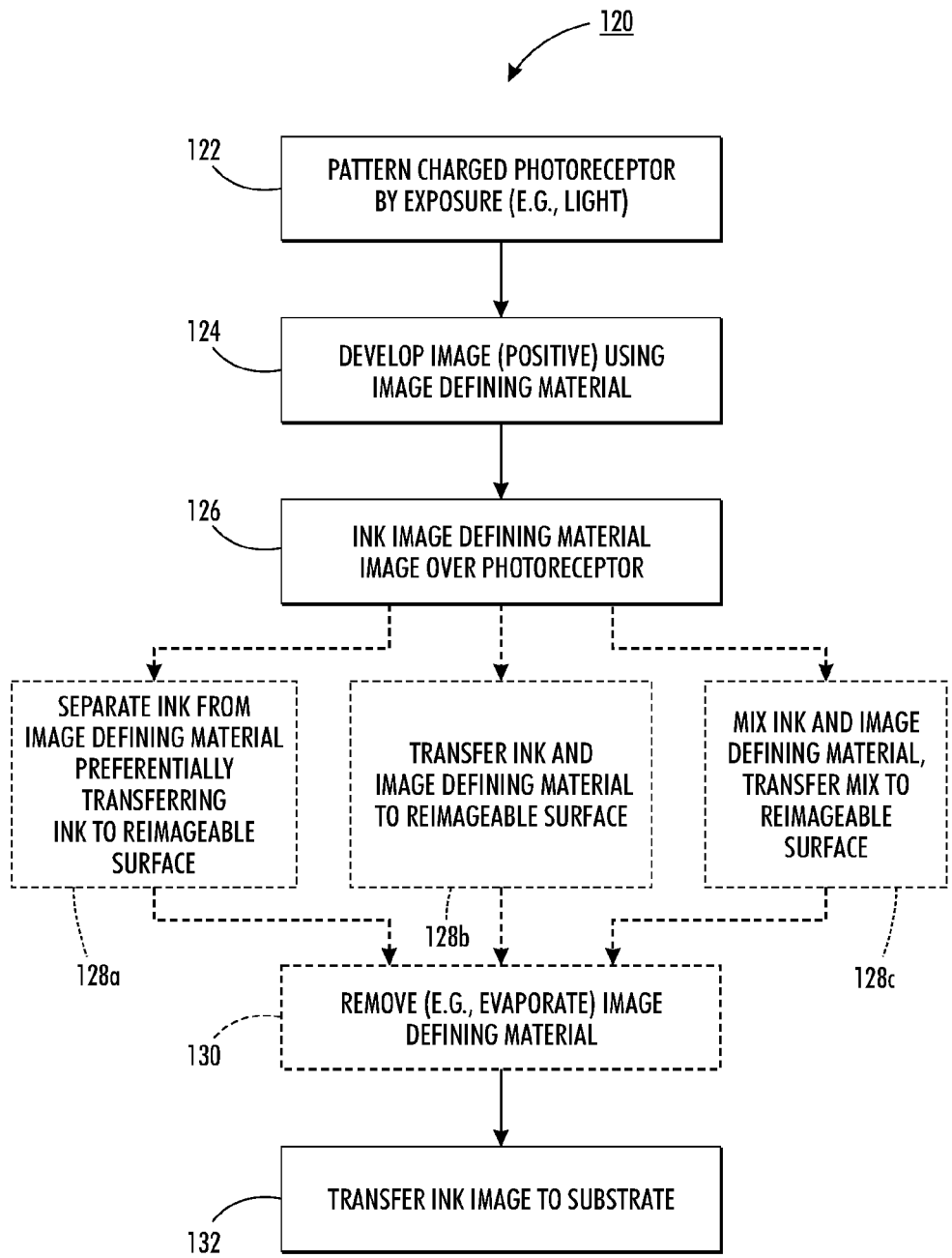
FIG. 8 is a flow diagram illustrating an embodiment of operation of a system for variable lithography for example of the type shown in FIG. 7.

Accordingly, another complete hybrid system and process is disclosed in which, with reference to FIG. 8, a charged photoreceptor is patterned at 122 and developed at 124 from image definition material utilizing certain aspects of a liquid electrophotography system and process, to form a latent positive of the image to be printed. Ink is applied selectively over the latent image of image definition material at 126. One of the following options is next employed: the ink is transferred to an imaging member, separating from the image definition material in the process and leaving the image definition material substantially remaining on the photoreceptor, as 128a; both the ink and the image definition material are transferred to the reimageable surface, at 128b; or the ink and image definition material mix, and the mixture is transferred to the reimageable surface, at 128c. Optionally, at least some of the image definition material may be removed, such as by evaporation, from either or both of the photoreceptor and the reimageable surface at 130. The inked image is then transferred to a substrate at 132 utilizing certain aspects of a variable data lithography system and process.

Figure 9:
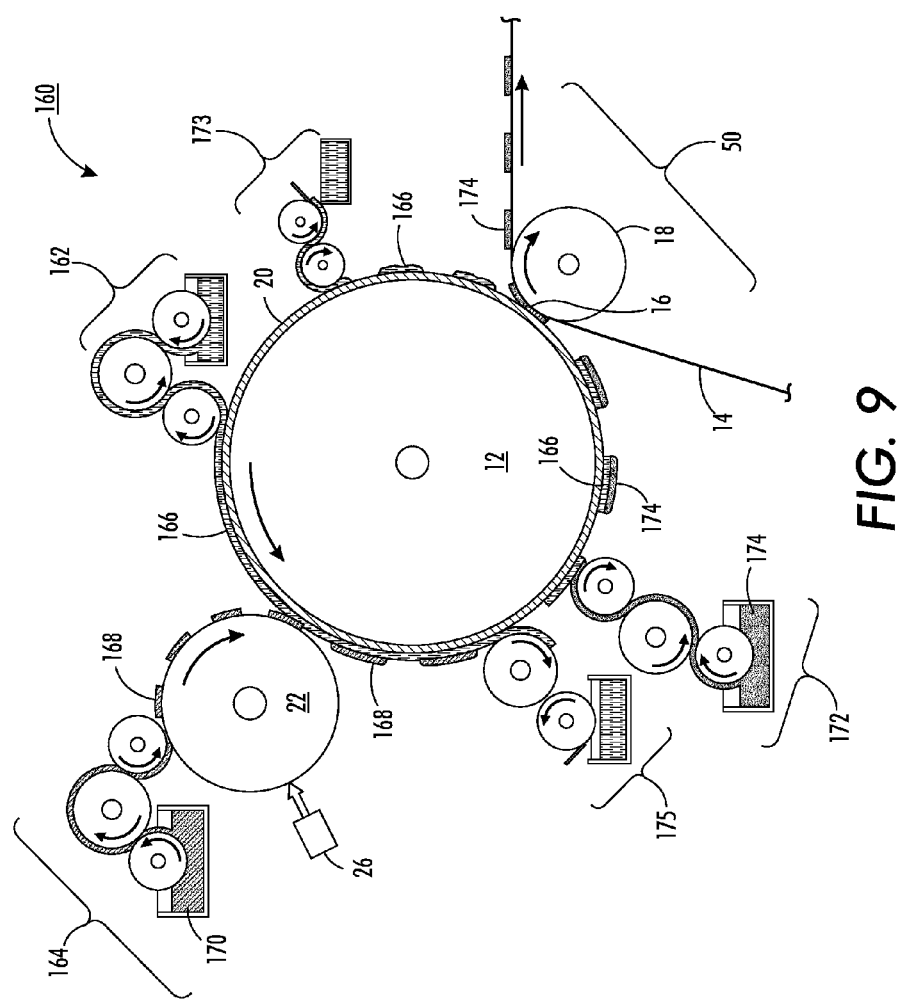
FIG. 9 is a side view of a system for variable lithography according to a still further embodiment of the present disclosure.

According to another embodiment 160 illustrated in FIG. 9, an image definition material subsystem 162 is disposed prior to a segregation material subsystem 164 in the direction of rotation of imaging member 12. Image definition material subsystem 162 provides a uniform coating 166 of image definition material over reimageable surface 20. Segregation material subsystem 164 forms a pattern of regions 168 of segregation material 170 on the surface of photoreceptor 22 as previously described. However, in the present embodiment segregation material 170 is strongly attractive to the image definition material. The regions 168 of segregation material are then transferred over image definition layer 166 on reimageable surface 20 such that they sit atop of or diffuse into regions of the image definition material. The placement of regions 168 in this embodiment corresponds to regions that will not be printed with ink in the final image applied to substrate 14 (negative image).

Figure 10:
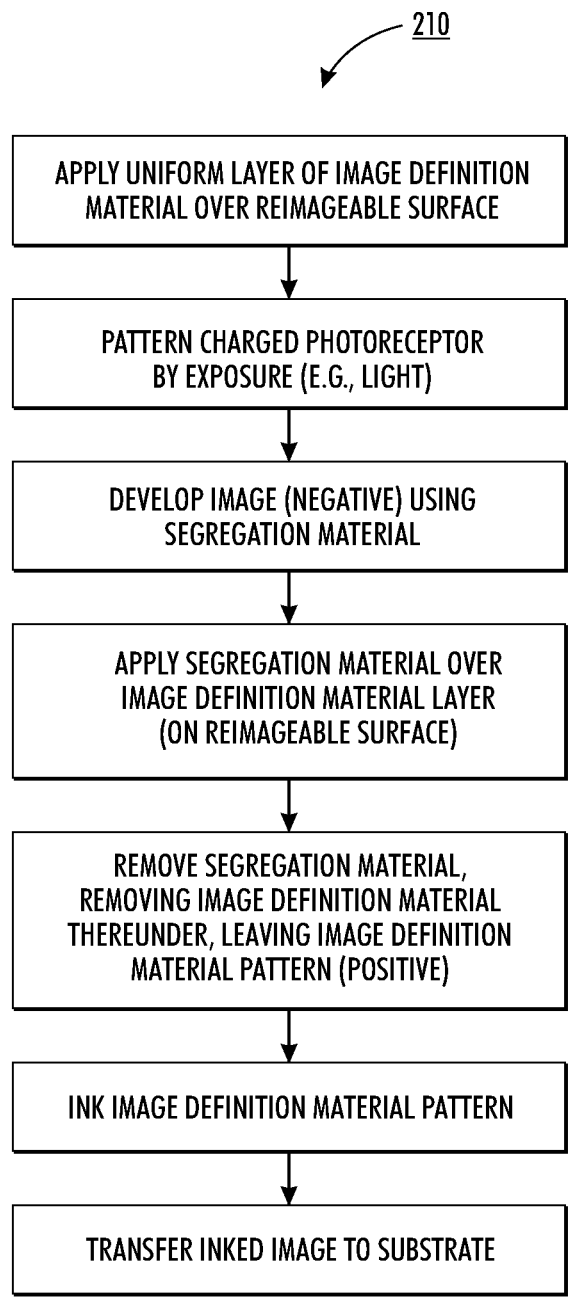
FIG. 10 is a flow diagram illustrating an embodiment of operation of a system for variable lithography for example of the type shown in FIG. 9.

A cleaning subsystem 175 is disposed following segregation material subsystem 164 such that the segregation material in regions 168 is removed from reimageable surface 20. The compositions of segregation material 170 and reimageable surface 20 are such that segregation material 170 easily releases from reimageable surface 20, particularly as compared to the image definition material. Binding energy of the segregation material to reimageable surface 20 may be reduced and/or binding energy of the segregation material to elements of cleaning subsystem 175 may be increased by electrostatic and/or magnetic control in the region of cleaning subsystem 173. In the process of removing segregation material in regions 168, the portion of image definition material under or within which the segregation material in regions 168 was deposited is removed together with the segregation material. This may be based on a physical, chemical, or electrostatic attraction between the image definition material and segregation material. The result is that following cleaning subsystem 175 and before nip 16 in the direction of rotation of imaging member 12 only image definition material remains on reimageable surface, and only in the desired pattern corresponding to the pattern ink to be transferred to substrate 14 (i.e., a positive image pattern). The image definition material pattern may then be inked by inking subsystem 172, such that ink 174 preferentially attaches over regions of image definition material remaining on reimageable surface 20 following cleaning by cleaning subsystem 175. The ink image now resident over image definition material 166 may then be transferred at nip 16 to substrate 14. Again, some of the image definition material may transfer with the ink to substrate 14. This material may evaporate, may provide a desired attribute of the fixed ink image, and so forth, as previously discussed. A corresponding method 210 is shown in FIG. 10.

Figure 11:
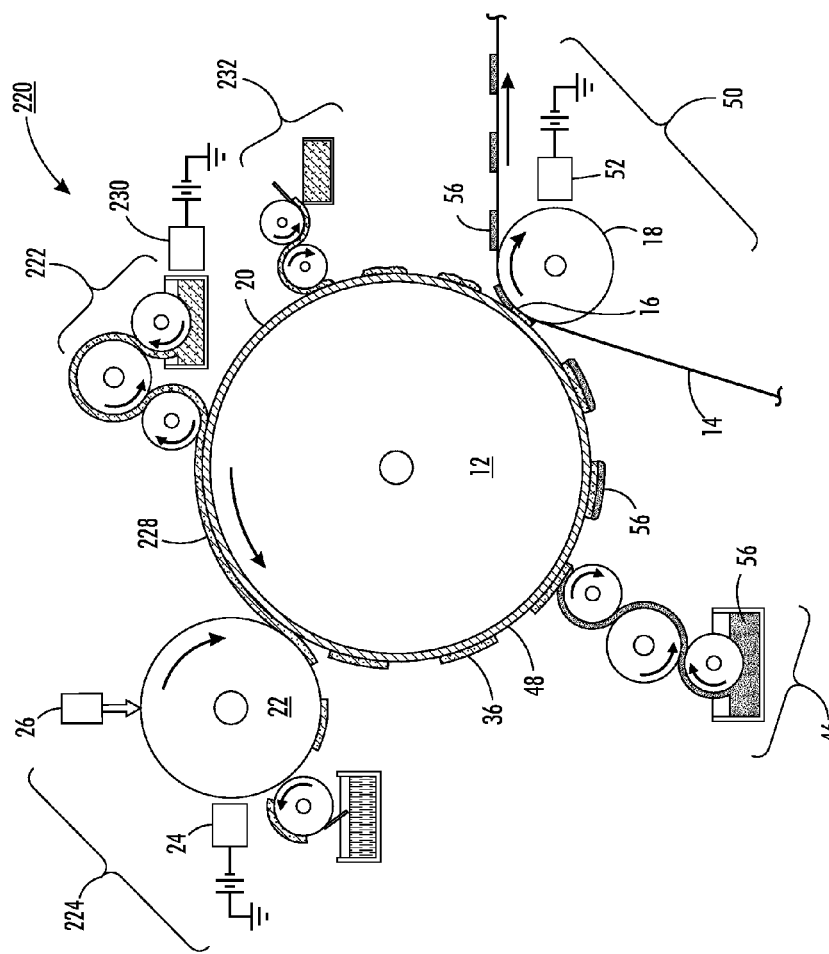
FIG. 11 is a side view of a system for variable lithography according to still another embodiment of the present disclosure.
Figure 12:
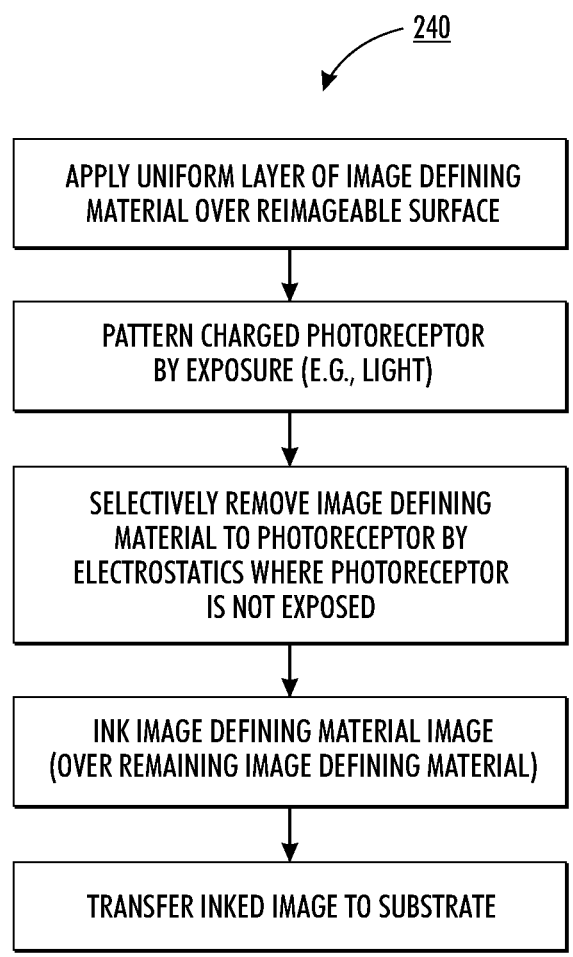
FIG. 12 is a flow diagram illustrating an embodiment of operation of a system for variable lithography for example of the type shown in FIG. 11.

In still another embodiment 220, as illustrated in FIG. 11, an image definition material subsystem 222 is disposed prior to a patterning subsystem 224 in the direction of rotation of imaging member 12. Image definition material subsystem 222 provides a uniform layer 228 of image definition material over reimageable surface 20. Patterning subsystem 224 forms a latent charge pattern on the surface of photoreceptor 22 by selectively exposing regions thereof to light from source 26. The latent charge pattern corresponds to a positive of the ink image that ultimately is to be transferred to substrate 14. In the present embodiment, image definition material is not formed over photoreceptor 22 as previously described. Rather, as photoreceptor 22 is proximate or comes into contact with image definition material layer 228, it extracts regions therefrom corresponding to the charge pattern on photoreceptor 22. This extraction may be as a consequence of, or enhanced by, a charge applied to particles within the image definition material by a charge subsystem 230, such a charge being of opposite polarity to a charge on photoreceptor 22 in regions not exposed by light source 26. The patterned reimageable surface 20 may then be inked by an inking subsystem 46, as previously described, with ink preferentially residing over regions of image definition material remaining on reimageable surface 20. The ink image may then be transferred to substrate 14, also as previously discussed. A corresponding method 240 is shown in FIG. 12.

In one embodiment for use with hydrophilic inks, the image definition material may be water or a water-based composition. In certain embodiments, the image definition material may be sacrificial, and consumed in a print cycle, such as by evaporation or removal and disposition such as by cleaning subsystem 54. Optionally, any image definition material remaining on reimageable surface 20 can be removed, recycled, and reused.

It will therefore be understood that while a water-based solution is one embodiment of an image definition material that may be employed in the embodiments of the present disclosure, other non-aqueous image definition materials with low surface tension, that are oleophilic, are vaporizable, decomposable, or otherwise selectively removable, etc. may be employed when used with low polarity inks. One such class of fluids is the class of HydroFluoroEthers (HFE), such as the Novec brand Engineered Fluids manufactured by 3M of St. Paul, Minn. These fluids have the following beneficial properties in light of the current disclosure: (1) they leave substantially no solid residue after evaporation, which can translate into relaxed cleaning requirements and/or improved long-term stability; (2) they have a low surface energy, as required for proper wetting of the imaging member; and, (3) they are benign in terms of the environment and toxicity. Additional additives may be provided to control the electrical conductivity of the image definition material over the photoreceptor. Other suitable alternatives include fluorinerts and other fluids known in the art, that have all or a majority of the above properties. It is also understood that these types of fluids may not only be used in their undiluted form, but as a constituent in an aqueous non-aqueous solution or emulsion as well.

In addition to or as an alternative to fluid-based image definition materials, dry image definition materials may be employed. In these implementations, a corresponding development subsystem for dry toner and the like will be employed. Such dry toner development subsystems may be, for example, of a type employed in xerography, such as cascade development, magnetic brush development, jumping development, etc., with a similar result of producing an image definition material image on the surface of the photoreceptor.

In one implementation, the dry image definition material is magnetic, permitting magnetic removal of the image definition material following transfer thereof with ink to the substrate, leaving substantially only the ink on the substrate surface, or alternatively, magnetic retention of the image definition material by the reimageable surface following splitting of the ink onto the substrate. In the latter case, retention of the image definition material to the reimageable surface may be assisted by a local magnetic field from a magnetic image definition material retention subsystem 57 disposed within and partially circumferentially around said imaging member and under control of controller 58, shown in FIG. 1. (Other magnetic field producing systems are also contemplated hereby.) Selective removal of the field can assist with cleaning of the reimageable surface in preparation for the next image writing pass, optionally together with application of a magnetic field by or in association with cleaning subsystem 54 of FIG. 1. In addition, magnetic image definition material transferred with ink to a substrate may be removed post-transfer, such as by a magnetic cleaning subsystem 59 shown in FIG. 1.

Reimageable surface 20 (FIG. 1) must facilitate the flow of ink onto its surface with uniformity and without beading or dewetting. Various materials such as silicone can be manufactured or textured to have a range of surface energies, and such energies can be tailored with additives. Reimageable surface 20, while nominally having a low value of dynamic chemical adhesion, may have a sufficient surface energy in order to promote efficient ink wetting/affinity without ink dewetting or beading.

A system having a single imaging cylinder 12, without an offset or blanket cylinder, is shown and described herein. The reimageable surface 20 is made from material that is conformal to the roughness of print media via a high-pressure impression cylinder, while it maintains good tensile strength necessary for high volume printing. Traditionally, this is the role of the offset or blanket cylinder in an offset printing system. However, requiring an offset roller implies a larger system with more component maintenance and repair/replacement issues, increased production cost, and added energy consumption to maintain rotational motion of the drum (or alternatively a belt, plate or the like). Therefore, while it is contemplated by the present disclosure that an offset cylinder may be employed in a complete printing system, such need not be the case. Rather, the reimageable surface layer may instead be brought directly into contact with the substrate to affect a transfer of an ink image from the reimageable surface layer to the substrate. Component cost, repair/replacement cost, and operational energy requirements are all thereby reduced.

It should be understood that when a first layer is referred to as being "on" or "over" a second layer or substrate, it can be directly on the second layer or substrate, or on an intervening layer or layers may be between the first layer and second layer or substrate. Further, when a first layer is referred to as being "on" or "over" a second layer or substrate, the first layer may cover the entire second layer or substrate or a portion of the second layer or substrate.

The realization and production of physical devices and their operation are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of exemplary embodiments have been presented in the foregoing detailed description, it should be understood that a vast number of variations exist, and these exemplary embodiments are merely representative examples, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A variable data lithography system, comprising:
   a photoreceptor;
   a charging subsystem for applying a first electrostatic charge to said photoreceptor;
   an exposure subsystem disposed for selective exposure of said photoreceptor to thereby form an exposure pattern from regions that are exposed and unexposed by said exposure subsystem on a surface of said photoreceptor, said exposure enabling altering the electrostatic charge on said photoreceptor to thereby define regions of said photoreceptor having a first electrostatic charge state and a second electrostatic charge state;
   an image definition material subsystem disposed proximate said photoreceptor for selectively applying an image definition material substantially over regions of said photoreceptor having said first electrostatic charge state and not over regions having said second electrostatic charge state to thereby form an image definition material image on a surface of said photoreceptor corresponding to said exposure pattern;
   an imaging member having a reimageable surface formed thereover, disposed proximate said photoreceptor such that said image definition material selectively applied over said photoreceptor is transferred over said reimageable surface, forming regions of image definition material separated by regions of no image definition material on said reimageable surface, and thereby transferring said image definition material image between said photoreceptor and said reimageable surface;
   an inking subsystem for selectively applying ink over said reimageable surface such that said ink preferentially occupies regions over said image definition material on said reimageable surface to thereby form an inked image over said reimageable surface; and
   an image transfer subsystem for transferring the ink over said image definition material to a substrate to thereby transfer said inked image from said reimageable surface to said substrates wherein said regions of said photoreceptor having a first electrostatic charge state have a first charge polarity, and further wherein said image definition material subsystem is configured such that image definition material applied thereby over said photoreceptor comprises electrostatically charged particles having a second charge polarity, said first charge polarity being opposite said second charge polarity,
   wherein said image definition material comprises a dampening fluid, said dampening fluid comprising a carrier fluid in which are disposed said electrostatically charged particles.

2. The variable data lithography system of claim 1, wherein said first electrostatic charge state corresponds to regions not exposed by said exposure subsystem, and second electrostatic charge state corresponds to regions exposed by said exposure subsystem.

3. The variable data lithography system of claim 1, wherein said image definition material subsystem further comprises a charge application subsystem for applying said electrostatic charge having said second charge polarity to said particles.

4. The variable data lithography system of claim 1, wherein said carrier fluid is electrically insulative.

5. The variable data lithography system of claim 1, wherein said particles are organic polymers.

6. The variable data lithography system of claim 1, wherein said particles are selected from the group consisting of: inorganic magnetic nanoparticles and inorganic dielectric nanoparticles.

7. The variable data lithography system of claim 1, further comprising a charge application device disposed proximate said imaging member and configured to apply an electrostatic charge of said first polarity to said imaging member such that said particles are electrostatically attracted to said reimageable surface during transfer thereof from said photoreceptor to said reimageable surface.

8. The variable data lithography system of claim 1, further comprising a charge application device disposed proximate said image transfer subsystem and configured to apply an electrostatic charge of a polarity opposite that of said first electrostatic charge to an element of said image transfer subsystem such that said particles, but not said ink, are electrostatically rejected in a region at which said ink transfers from said reimageable surface to said substrate.

9. The variable data lithography system of claim 1, further comprising a viscosity control subsystem disposed proximate said photoreceptor following said image definition material subsystem in a direction of motion of said photoreceptor for controlling the viscosity of image definition material on the surface of said photoreceptor prior to transfer of said image definition material to said imaging member.

10. The variable data lithography system of claim 9, wherein said viscosity control subsystem comprises a heating element configured to direct heat energy toward said photoreceptor.

11. The variable data lithography system of claim 1, further comprising a segregation material subsystem disposed proximate said reimageable surface and between said photoreceptor and said inking subsystem in a direction of motion of said imaging member, said segregation material subsystem configured to selectively deposit segregation material substantially in said regions of no image definition material over said reimageable surface.

12. The variable data lithography system of claim 1, further comprising a segregation material subsystem disposed proximate said photoreceptor and between said image definition material subsystem and a point at which said image definition material is transferred to said reimageable surface in a direction of motion of said imaging member, said segregation material subsystem configured to selectively deposit segregation material substantially in regions of no image definition material over said photoreceptor, and further wherein said reimageable surface is configured to receive both said image definition material and said segregation material in a pattern substantially corresponding to said image definition material image with said segregation material substantially occupying said regions of no image definition material over said reimageable surface.

13. The variable data lithography system of claim 1, wherein said image definition material comprises magnetic particles disposed in a carrier fluid.

14. The variable data lithography system of claim 13, further comprising a cleaning subsystem, disposed proximate said imaging member and following said image transfer subsystem, for cleaning, at least in part by way of magnetic attraction of said magnetic particles, residual image definition material from said reimageable surface.

15. A variable data lithography system, comprising:
   a photoreceptor;
   a charging subsystem for applying a first electrostatic charge having a value and a first charge polarity to said photoreceptor;
   an exposure subsystem disposed for selective exposure of said photoreceptor to thereby form an exposure pattern from regions that are exposed and unexposed by said exposure subsystem on a surface of said photoreceptor, said exposure altering the electrostatic charge on said photoreceptor to thereby define regions of said photoreceptor having a first electrostatic charge state corresponding to regions not exposed by said exposure subsystem and a second electrostatic charge state corresponding to regions exposed by said exposure subsystem;
   an image definition material subsystem disposed proximate said photoreceptor for selectively applying an image definition material layer substantially over regions of said photoreceptor having said first electrostatic charge state and not over regions having said second electrostatic charge state to thereby form an image definition material image on a surface of said photoreceptor corresponding to said exposure pattern, said image definition material comprising a dampening fluid, said dampening fluid comprising a carrier fluid comprising an electrostatically insulative carrier fluid in which is disposed electrostatically charged particles having a second charge polarity, said first charge polarity being opposite said second charge polarity;
   an imaging member having a reimageable surface formed thereover and having a second electrostatic charge of a value greater than said value of said first electrostatic charge, disposed proximate said photoreceptor such that said image definition material selectively applied over said photoreceptor is transferred to said reimageable surface, forming regions of image definition material separated by regions of no image definition material on said reimageable surface, and thereby transferring said image definition material image from said photoreceptor to said reimageable surface;
   an inking subsystem for selectively applying ink over said reimageable surface such that said ink preferentially occupies regions of image definition material on said reimageable surface to thereby form an inked image corresponding to said image definition material image over said reimageable surface; and
   an image transfer subsystem for transferring the ink occupying said regions of image definition material on said reimageable surface to a substrate to thereby transfer said inked image from said reimageable surface to said substrates wherein said regions of said photoreceptor having a first electrostatic charge state have a first charge polarity, and further wherein said image definition material subsystem is configured such that image definition material applied thereby over said photoreceptor comprises electrostatically charged particles having a second charge polarity, said first charge polarity being opposite said second charge polarity.

\* \* \* \* \*